United States Patent [19]
Le Garrec

[11] Patent Number: 5,970,071
[45] Date of Patent: Oct. 19, 1999

[54] METHOD AND DEVICE FOR INSERTION OF ASYNCHRONOUS DATA IN A DIGITAL SIGNAL

[75] Inventor: Thomas Le Garrec, Achenheim, France

[73] Assignee: Thomson multimedia S.A., Courbevoie, France

[21] Appl. No.: 08/492,600

[22] Filed: Jun. 20, 1995

[30] Foreign Application Priority Data

Jul. 1, 1994 [FR] France ................................. 9408195

[51] Int. Cl.⁶ ....................................................... H04J 3/12
[52] U.S. Cl. ........................................................ 370/528
[58] Field of Search .................................... 370/365, 356, 370/362, 389, 543, 538, 465, 466, 528, 529, 527, 503, 518, 516, 517; 364/572, 581, 582, 604, 400.01; 375/365, 356, 363, 371, 373, 226

[56] References Cited

U.S. PATENT DOCUMENTS

5,274,372 12/1993 Luthra et al. .............................. 341/61
5,323,391 6/1994 Harrison ..................................... 370/70

*Primary Examiner*—Dang Ton
*Attorney, Agent, or Firm*—Joseph S. Tripoli; Peter M. Emanuel; Frederick A. Wein

[57] ABSTRACT

The disclosure concerns a procedure for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the samples being presented to a polyphase filter for which a set of coefficients is associated with a specific phase error previously introduced by said associations, the filtered samples being included in the digitized signal. The invention also includes a device that implements the above insertion procedure. The invention is applicable notably in the field of insertion of Teletext data into a digitized video signal.

19 Claims, 6 Drawing Sheets

| SAMPLES | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| FIG. 4A BIT SORTED BY PROTOCOL | $B_1$ | $B_1$ | $B_1$ | $B_1$ | $B_2$ | $B_2$ | $B_2$ | $B_2$ | $B_3$ | $B_3$ | $B_3$ | $B_3$ | $B_4$ | $B_4$ | $B_4$ | $B_4$ | $B_5$ | $B_5$ | $B_5$ | $B_5$ | $B_6$ | $B_6$ | $B_6$ | $B_6$ | $B_7$ | $B_7$ | $B_7$ | $B_7$ | $B_8$ | $B_8$ | $B_8$ | $B_8$ | $B_9$ | $B_9$ | $B_9$ | $B_9$ | $B_{10}$ | $B_{10}$ | $B_{10}$ | $B_{10}$ | $B_{11}$ | $B_{11}$ | $B_{11}$ | $B_{11}$ | $B_{12}$ | $B_{12}$ | $B_{12}$ |
| FIG. 4B DECIMATION | 0 | 0 | 0 | $B_1$ | 0 | 0 | 0 | $B_2$ | 0 | 0 | 0 | $B_3$ | 0 | 0 | 0 | $B_4$ | 0 | 0 | 0 | $B_5$ | 0 | 0 | 0 | $B_6$ | 0 | 0 | 0 | $B_7$ | 0 | 0 | 0 | $B_8$ | 0 | 0 | 0 | $B_9$ | 0 | 0 | 0 | $B_{10}$ | 0 | 0 | 0 | $B_{11}$ | 0 | 0 | $B_{12}$ |
| FIG. 4C RESTORATION | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

METHOD AND DEVICE FOR INSERTION OF ASYNCHRONOUS DATA IN A DIGITAL SIGNAL

BACKGROUND OF THE INVENTION

The invention concerns a method and a device for insertion of digital data having a first bit rate into a stream of digital data having a second bit rate greater than the first. The invention is can be used notably for the insertion of Teletext data in a digitized video signal.

Classically, during an "analog" transmission, Teletext data are inserted in the composite analog video signal in the lines of the vertical blanking interval.

In image compression systems, the data corresponding to the image and supplementary data such as Teletext data can be transmitted in different packets. Since some receivers incorporate Teletext decoders, to avoid redundancy in the Teletext function in the compressed signal decoder, an analog video signal containing the Teletext data is fed to the receiver.

The bit rate of the Teletext data is 6.9375 Mbit/s, whereas the frequency of a video source complying with the CCIR 601 digital standard Is 13.5 MHz for the luminance.

SUMMARY OF THE INVENTION

The goal of the invention is a method for insertion of samples representing digital data from a first source having a first bit rate in a digitized signal from a second source having a second bit rate, wherein the second bit rate is greater than the first bit rate and each data of the first source is associated with least one sample of a series of samples at the second bit rate, the samples being presented to a polyphase filter for which each set of coefficients is associated with a specific phase error previously introduced by said associations, the filtered samples being included in the digitized signal.

The term "included" is not limited to the replacement of samples of the digitized signal by multiplexing with filtered samples, but also includes notably the addition of filtered samples to the samples of the digitized signal.

In a particular embodiment of the invention, the sets of coefficients of the filter are deduced from the required wave-form of the data from the first source in the digitized signal.

In a particular embodiment of the invention, the polyphase filter includes a memory in which are stored the possible results of the filtering, said memory being addressed, for each current sample of the convolution window of the filter, first by data representing the phase error associated with this sample and secondly by data representing the content of the convolution window.

In a particular embodiment of the invention, the association of the data from the first source with samples whose bit rate is that of the second source is carried out such that on average a data from the first source is associated substantially with Q samples, where:

$$Q=Fp/Fb$$

Fb and Fp being respectively the bit rates of the first and second sources.

In a particular embodiment of the invention, the association of the data from the first source with samples whose bit rate is that of the second source is carried out such that M data from the first source are associated with N samples, where M and N are the smallest integers for which:

$$Fp/Fb=N/M$$

In a particular embodiment of the invention, a data from the first source is repeated as long as the theoretical repetition rate is less than the current repetition rate, the theoretical repetition rate being the ratio Fp/Fb, and the current repetition rate being the ratio between the number of samples emitted and the number of data emitted by the first source.

In a particular embodiment of the invention, among the samples carrying the same data from the first source, all except one are forced to the null value.

In a particular embodiment of the invention, among the samples all carrying the same data from the first source, the sample that retains its initial value is the first sample carrying this data.

In a particular embodiment of the invention, said samples emitted at the bit rate of the second source carry a data from the first source when the theoretical repetition rate becomes greater than current repetition rate, the theoretical repetition rate being the ratio Fp/Fb, and the current repetition rate being the ratio of the number of samples emitted to the number of different data emitted by the first source; all the other samples have the null value.

In a particular embodiment of the invention, certain samples being repeated X times, where X is equal to the theoretical repetition rate, rounded to the nearest integer, the first sample following a series of samples associated with a data non-repeated X times is said to be in phase rupture.

In a particular embodiment of the invention, the samples presented to the polyphase filter are offset such that no phase rupture appears in the convolution window.

In a particular embodiment of the Invention, the series of samples crosses the convolution window of the polyphase filter, said window containing a sample referred to as the "current sample",

- as long as no sample in phase rupture has entered the convolution window, no modification of the samples takes place;
- when a sample in phase rupture is to the left of the current sample, it and its successors are shifted by one sample towards the left;
- when a sample in phase rupture is the current sample or if it is located to the right of the current sample, its predecessors are shifted by one sample towards the right.

In a particular embodiment of the invention, the said first source is a binary source of Teletext data.

In a particular embodiment of the invention, said digitized signal is a signal compliant with the CCIR 601 digital standard.

In a particular embodiment of the invention, said required wave-form is similar to the pulse corresponding to a bit defined in the Teletext specification.

In a particular embodiment, the sets of coefficients are defined by:

$$C(P,X)=k*(0.5+0.5Cos\ (\pi(m*X+Fp*P))$$

where X is a coefficient within the set,

P is the phase error associated with the set, k is a constant, m is a constant that is a function of the number of coefficients per set.

Another goal of the invention is a device for insertion of samples representing digital data from a first source having a first bit rate in a digitized signal from a second source having a second bit rate, wherein the second bit rate is greater than the first bit rate, said device including means of association of the data from the first source with one or more samples at the bit rate of the second source, means of polyphase filtering said samples whose sets of coefficients dependent of the phase errors previously introduced, and means of inclusion of the filtered samples in the digitized signal.

In a particular embodiment of the invention, said means of association include means of memorization of the number of samples to be associated with each data from the first source.

In a particular embodiment of the invention, the device also includes means of decimation of the sequence of samples carrying the data from the first source, said means of decimation forcing all the samples carrying the same data to zero, except for one of these samples.

In a particular embodiment of the invention, the device also includes a shift register and means of multiplexing controlled in such a way that the samples presented to the filter are not in phase rupture.

In a particular embodiment of the invention, the means of polyphase filtering include means of memorization of the possible results of said filtering, said means of memorization being addressed by making use of the content of the convolution window of the filter and the phase errors associated with each sample.

Another goal of the invention is a method for insertion of samples representing first digital data having a first bit rate in a digitized signal from a second source having a second bit rate, wherein the second bit rate is greater than the first bit rate, and each of the first data is associated with at least one sample of a series of samples at the second bit rate, and a correction is made of the phase error introduced by said association.

In a particular embodiment, said correction is carried out using a polyphase filter for which each set of coefficients is associated with a specific phase error previously introduced by said associations.

BRIEF DESCRIPTION OF THE DRAWINGS

The invention will be better understood and other advantages and characteristics will become clear on reading the following description making reference to the appended figures, of which.

In the present embodiment, the digitized signal is a video signal compliant with the CCIR 601 digital standard, the bit rate being 13.5 MHz (corresponding to 13.5 Mbyte/s) for the luminance. The Teletext information is a binary signal of bit rate 6.9375 Mbit/s.

Figure 1:
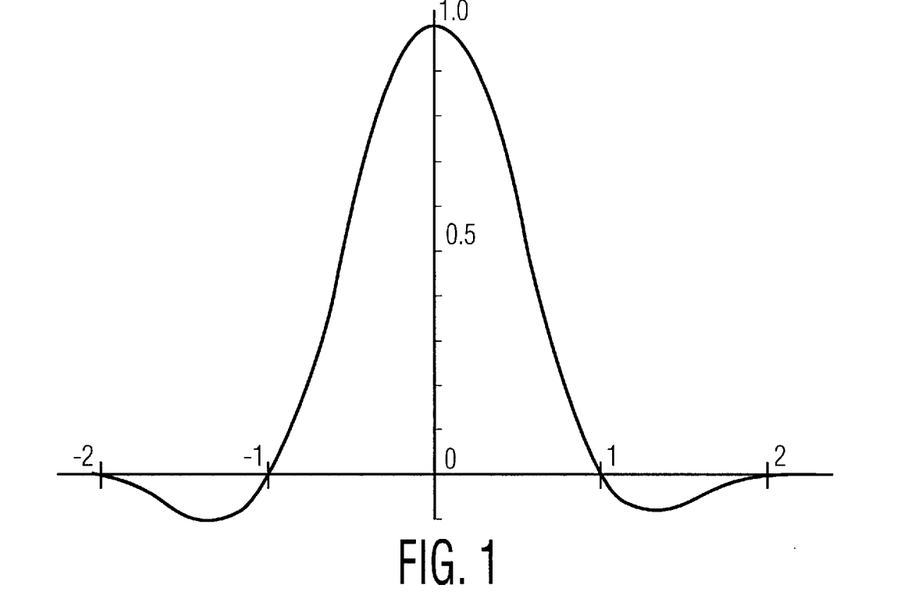
FIG. 1 shows a pulse corresponding to a real bit complying with the Teletext specification.

FIG. 1 shows the shape of a pulse corresponding to a bit of value 1 complying with the Teletext specification. A bit of the binary signal mentioned in the previous paragraph must therefore be processed so as to include samples in the digitized video signal such that, once the digitized video signal has been re-transformed into an analog signal, the samples corresponding to this bit will give In the analog domain a pulse very close to that prescribed by the Teletext specification.

In the rest of this description we shall denote by Fp the bit rate of the digital video source and Fb the bit rate of the source of Teletext bits. In the present example, Fp is taken to be equal to 27 MHz, given that the components Y, U, V are time-division multiplexed and that each of the components U, V has a bit rate of 6.75 Mbytes/s.

Figure 2:
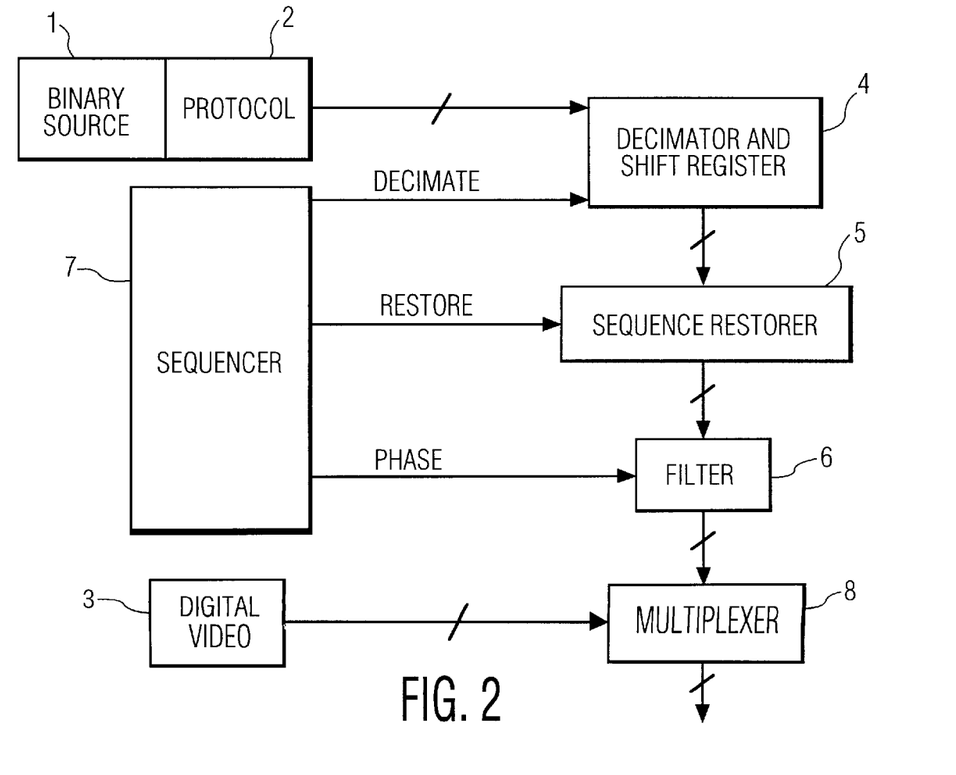
FIG. 2 is a functional block diagram of the device according to the invention.

FIG. 2 shows a block diagram of the device according to the invention. A binary source 1 supplies the Teletext information as a series of bits at its own bit rate Fb. These data are stored in a buffer memory and read by means of a protocol which supplies to a decimator and shift register 4 a stream of bits at the rate Fp of the samples of the digital video source 3, The shift register 4 presents in parallel a certain number of bits to a sequence restorer 5. The role of this restorer 5 will be explained later. The number of bits in parallel at the output of the restorer 5 is the same as at the output of the register 4 and corresponds to the convolution window of a filter 6, which in the present embodiment is a polyphase filter. The signal at the output of the filter 6 is a signal coded using as many bits as is the digital video signal. In the present example, the digital video signal is coded using 8 bits.

A sequencer circuit 7 produces the signals "Decimate", "Restore" and "Phase" controlling respectively the circuits 4, 5 and 6. It is synchronized with the horizontal and vertical synchronization signals of the digitized video signal.

The filtered samples are multiplexed in the digitized signal by a multiplexer 8.

The role of the protocol is to match as far as possible the same time scale for the binary values from the buffer memory 2 and the samples of the digital video source. Given that the binary source outputs bits more slowly than the digital video source, a given bit from the binary source could be provided more times by the protocol to be associated with more than one sample. In other words, the bits from the binary source can be "spread" in time over one or more samples at the frequency Fp.

For example, if the ratio between Fp and Fb 3, a bit from the binary source would be repeated by the protocol precisely during three samples at the frequency Fp.

More generally, we define the two smallest integers M and N for which:

$$Fp/Fb=N/M \text{ or } N/Fp=M/Fb$$

In the general case, the ratio N/M will be non-integer. In the case of the present embodiment, we find N=144 and M=37, or N/M=3,89189. In the rest of this description, this ratio is referred to as the theoretical repetition rate: not being integer in the present case, it is obvious that this rate is nominal, and that we can not use exactly this rate since a "partial" repetition of a binary value is not possible. Therefore, in order that this rate be respected on average, some bits will be repeated more often than others.

In the case of Teletext, a bit of Teletext data will be associated with about 4 samples, 4 being the nearest integer to the ratio N/M.

The spreading carried out by the protocol will on average be exactly equal to N/M after every cycle of M bits at the frequency Fb, or every cycle of N samples at the frequency Fp, the period N/Fp being equal to the period M/Fb. The objective of the theoretical repetition rate will be therefore be attained on average for M bits spread over N samples.

In the present embodiment, the protocol Is designed to match fairly closely, at the level of each bit emitted by the protocol, the theoretical repetition rate. In this way the phase error introduced is minimized. The phase we are referring to here can be defined as the delay between the theoretical position of a bit from the binary source and the sample with which it is associated.

In the present embodiment, the protocol is defined as follows:

```
START
    Emit the first bit
    Calculate the current repetition rate
    IF (Current repetition rate<Theoretical repetition rate) THEN
        Repeat last bit emitted
    ELSE
        Emit next bit
    ENDIF
END
```

The current repetition rate is defined as the ratio between the number of samples emitted by the source since the start of the cycle and the number of different bits emitted by the protocol since the start of the cycle.

The algorithm presented above is particularly simple, but other protocols can also be used.

A cycle according to the algorithm described will be as shown in Table 1:

TABLE 1

Number of bit emitted by the protocol/Number of the sample

| | | | | | |
|---|---|---|---|---|---|
| 1/1 | 7/25 | 13/49 | 19/73 | 25/97 | 31/121 |
| 1/2 | 7/26 | 13/50 | 19/14 | 25/98 | 32/122 |
| 1/3 | 7/27 | 13/51 | 20/75 | 26/99 | 32/123 |
| 1/4 | 7/28 | 14/52 | 20/76 | 26/100 | 32/124 |
| 2/5 | 8/29 | 14/53 | 20/77 | 26/101 | 32/125 |
| 2/6 | 8/30 | 14/54 | 20/78 | 26/102 | 33/126 |
| 2/7 | 8/31 | 14/55 | 21/79 | 27/103 | 33/127 |
| 2/8 | 8/32 | 15/56 | 21/80 | 27/104 | 33/128 |
| 3/9 | 9/33 | 15/57 | 21/81 | 27/105 | 33/129 |
| 3/10 | 9/34 | 15/58 | 21/82 | 27/106 | 34/130 |
| 3/11 | 9/35 | 15/59 | 22/83 | 28/107 | 34/131 |
| 3/12 | 9/36 | 16/60 | 22/84 | 28/108 | 34/132 |
| 4/13 | 10/37 | 16/61 | 22/85 | 28/109 | 34/133 |
| 4/14 | 10/38 | 16/62 | 22/86 | 29/110 | 35/134 |
| 4/15 | 10/39 | 16/63 | 23/87 | 29/111 | 35/135 |
| 4/16 | 11/40 | 17/64 | 23/88 | 29/112 | 35/136 |
| 5/17 | 11/41 | 17/65 | 23/89 | 29/113 | 35/137 |
| 5/18 | 11/42 | 17/66 | 23/90 | 30/114 | 36/138 |
| 5/19 | 11/43 | 17/67 | 24/91 | 30/115 | 36/139 |
| 5/20 | 12/44 | 18/68 | 24/92 | 30/116 | 36/140 |
| 6/21 | 12/45 | 18/69 | 24/93 | 30/117 | 36/141 |
| 6/22 | 12/46 | 18/70 | 24/94 | 31/118 | 37/142 |
| 6/23 | 12/47 | 18/71 | 25/95 | 31/119 | 37/143 |
| 6/24 | 13/48 | 19/72 | 25/96 | 31/120 | 37/144 |
| 1/1 | 7/25 | 13/49 | 19/73 | 25/97 | 31/121 |
| 1/2 | 7/26 | 13/50 | 19/74 | 25/98 | 32/122 |
| 1/3 | 7/27 | 13/51 | 20/75 | 26/99 | 32/123 |
| 1/4 | 7/28 | 14/52 | 20/76 | 26/100 | 32/124 |
| 2/5 | 8/29 | 14/53 | 20/77 | 26/101 | 32/125 |
| 2/6 | 8/30 | 14/54 | 20/78 | 26/102 | 33/126 |
| 2/7 | 8/31 | 14/55 | 21/79 | 27/103 | 33/127 |
| 2/8 | 8/32 | 15/56 | 21/80 | 27/104 | 33/128 |

TABLE 1-continued

Number of bit emitted by the protocol/Number of the sample

| | | | | | |
|---|---|---|---|---|---|
| 3/9 | 9/33 | 15/57 | 21/81 | 27/105 | 33/129 |
| 3/10 | 9/34 | 15/58 | 21/82 | 27/106 | 34/130 |
| 3/11 | 9/35 | 15/59 | 22/83 | 28/107 | 34/131 |
| 3/12 | 9/36 | 16/60 | 22/84 | 28/108 | 34/132 |
| 4/13 | 10/37 | 16/61 | 22/85 | 28/109 | 34/133 |
| 4/14 | 10/38 | 16/62 | 22/86 | 29/110 | 35/134 |
| 4/15 | 10/39 | 16/63 | 23/87 | 29/111 | 35/135 |
| 4/16 | 11/40 | 17/64 | 23/88 | 29/112 | 35/136 |
| 5/17 | 11/41 | 17/65 | 23/89 | 29/113 | 35/137 |
| 5/18 | 11/42 | 17/66 | 23/90 | 30/114 | 36/138 |
| 5/19 | 11/43 | 17/67 | 24/91 | 30/115 | 36/139 |
| 5/20 | 12/44 | 18/68 | 24/92 | 30/116 | 36/140 |
| 6/21 | 12/45 | 18/69 | 24/93 | 30/117 | 36/141 |
| 6/22 | 12/46 | 18/70 | 24/94 | 31/118 | 37/142 |
| 6/23 | 12/47 | 18/71 | 25/95 | 31/119 | 37/143 |
| 6/24 | 13/48 | 19/72 | 25/96 | 31/120 | 37/144 |

Bits 10, 19, 28 and 37 are repeated only three times, whereas all the other bits are repeated four times. By repeating bits only three times, this enables us to correct, by means of a phase shift corresponding to the non-repetition, the phase errors introduced by the repetition of other bits four times in a row. This correction is, of course, only perfect at the end of the cycle.

We therefore advance by one sample the first emission of bits 11, 20, 29 and "38", the latter bit being in fact the first bit of the next cycle.

Figure 3:
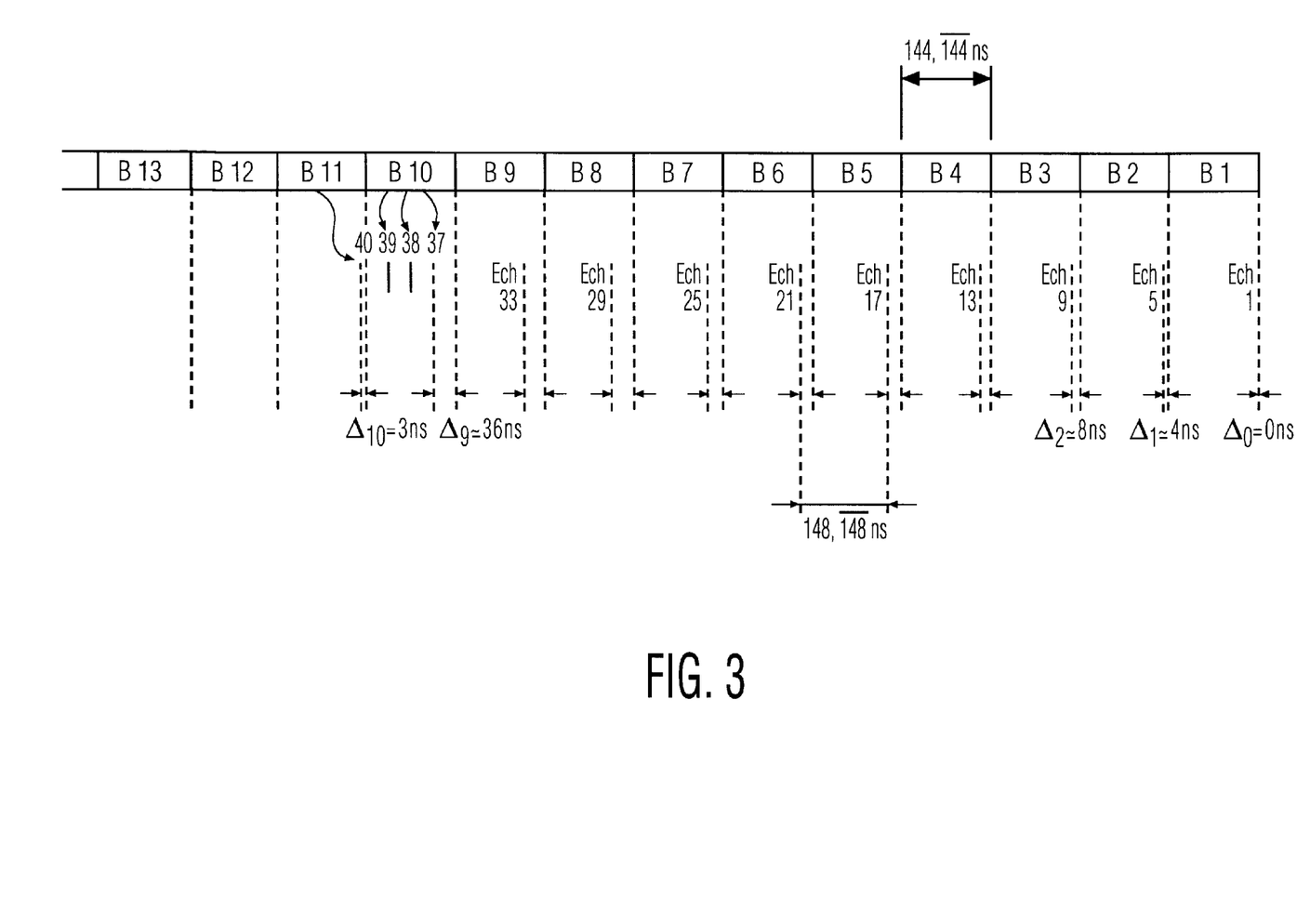
FIG. 3 is a diagram showing the accumulation of the phase errors during part of a cycle.

FIG. 3 shows how the phase error cumulates bit by bit and sample by sample. A Teletext data bit normally has a duration of $1/Fp=144.144$ ns (in this figure Bi designates the i th bit of a cycle). Spread over four samples, the effective duration will be in fact $4/Fb=148.148$ ns, or 4.004 ns longer. Sample 37, the first sample destined to be associated with the bit 10, will have an advance of $\Delta=9\times4.004=36.036$ ns on this bit. The protocol will associate bit number 10 only to three samples instead of four, which enables the advance $\Delta$ to be partially recovered. The period being $1/Fb=37.037$ ns, the start of the next bit (number 11) will be this time have an advance of 3.003 ns on the sample 40. Only at the 145th sample (first sample of the next cycle) will the phases coincide exactly.

Table 2 indicates the advances $\Delta$ for each sample of a cycle in which a bit new is associated by the protocol.

TABLE 2

| Number of sample | Delay in ns (truncated) | Number of sample | Delay in ns (truncated) |
|---|---|---|---|
| 1 | 0 | 75 | 39 − 37 = 2 |
| 5 | 4 | 79 | 6 |
| 9 | 8 | 83 | 10 |
| 13 | 12 | 87 | 14 |
| 17 | 16 | 91 | 18 |
| 21 | 20 | 95 | 22 |
| 25 | 24 | 99 | 26 |
| 29 | 28 | 103 | 30 |
| 33 | 32 | 107 | 34 |
| 37 | 36 | 110 | 38 − 37 = 1 |
| 40 | 40 − 37 = 3 | 114 | 5 |
| 44 | 7 | 118 | 9 |
| 48 | 11 | 122 | 13 |
| 52 | 15 | 126 | 17 |
| 56 | 19 | 130 | 21 |
| 60 | 23 | 134 | 25 |
| 64 | 27 | 138 | 29 |
| 68 | 31 | 142 | 33 |
| 72 | 35 | 145 | 37 − 37 = 0 |

Table 2 can be memorized simply by storing the phase errors associated with the samples that correspond to a phase rupture (samples 1, 40, 75 and 110 in the present case). The phase errors corresponding to all the other samples are deduced simply from the phase error of the closest previous sample in rupture and from the number of periods of Fp between these two samples.

For example, the phase error associated with sample 38 is deduced from the phase error of sample 1 (0 ns in our example) and from the fact that 37 periods each with an error of 1.001 separate these two samples: the total error will then be (0+37)*1.001=37.037 ns.

The error associated with sample 94 will be equal to (2+94−75)*1.001=21.021 ns.

The phase shifts are therefore introduced deliberately, at known positions.

The positions of the bits that are repeated only three times are the same for all the cycles. In a variant of the present embodiment, the practical implementation of the protocol is made in the form of a reference table that gives the number of repetitions of a bit as a function of its number relative to the start of a cycle. This avoids the calculation of the divisions necessary in case of direct implementation of the algorithm given earlier. Notably, it is sufficient to memorize the numbers of the bits that are repeated only three times, which provides a significant economy of memory.

Figure 4A:
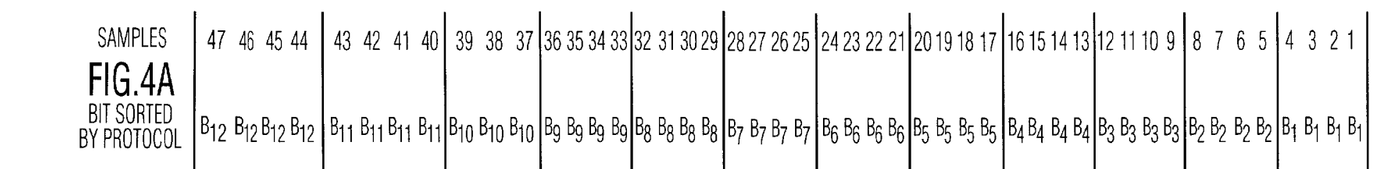
FIG. 4a illustrates the distribution of data from the first source in the samples.

FIG. 4a shows the bits distributed on miscellaneous samples at the output of the protocol.

Figure 4B:
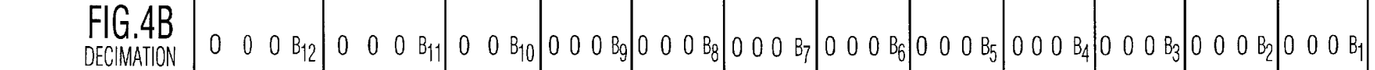
FIG. 4b illustrates the decimation carried out on these samples.

The shift register and decimator 4 receive the bits in series from the protocol. The decimator carries out the following operation: on a series of samples carrying the same bit, all the samples except one are forced to zero. In the present embodiment, the position of the sample that is not set to zero is that of the first sample of the series: this is the sample said to be "valid". FIG. 4b shows the effect of the decimator on the stream of samples, once they are in the shift register. The values of Bi can be 1 or 0. The values of the other positions are forced to zero. The shift register is used to make a serial-parallel conversion. This operation is necessary for the processing carried out by the sequence restorer circuit 5.

In the present embodiment, it is the sequencer 7 that generates a "Decimate" signal that indicates to the shift register 4 whether it must accept sample coming from the protocol or whether it must force it to 0.

In the present embodiment, the function of the protocol and of the decimator are separate, notably to expose by simple stages the operation of the device. In a variant, the function of the protocol and of the decimator are combined: the protocol emits a bit Bi followed by two or three zeros, depending on the information provided by table 1.

Figure 5:
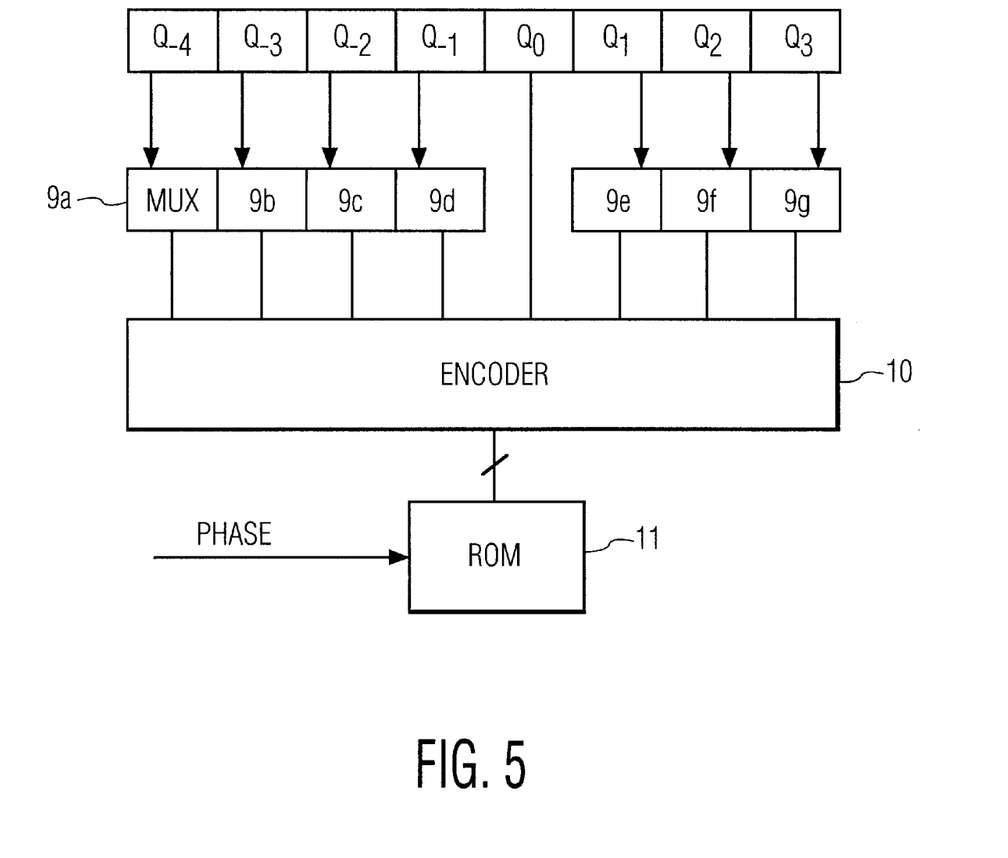
FIG. 5 is a functional block diagram of the shift register and the multiplexing carried out to avoid phase shifts in the convolution window.

In the present example, and as shown in FIG. 5, the shift register comprises eight 1-bit memories, numbered from Q-4 to Q3, where Q0 is the current bit. The sequence restorer circuit 5 includes 7 double-input multiplexers (9a to 8g) connected as follows:

TABLE 3

| Multiplexer | 9a | 9b | 9c | 9d | 9e | 9f | 9g |
|---|---|---|---|---|---|---|---|
| Connections | Q-4, Q-3 | Q-3, Q-2 | Q-2, Q-1 | Q-1, Q0 | Q0, Q1 | Q1, Q2 | Q2, Q3 |

The outputs of each of the multiplexers and that of the memory Q0 are connected to the input of an address coder 10.

The multiplexers are controlled by making use of the state of the signal called "Restore", a binary signal indicating, among the samples not previously decimated, which have undergone a phase correction by having been advanced by one sample.

Figure 4C:
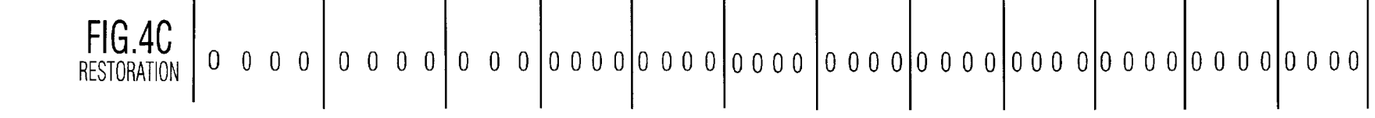
FIG. 4c illustrates the restore signal indicating the phase shifts.

FIG. 4c shows the state of the Restore signal relative to the Decimate signal. In the framework of the present embodiment, Restore is 1 only for samples 40, 75, 110 and "145".

The role of the sequence restorer is to present to the filter a sequence of samples without phase rupture, by manipulating the samples present in the convolution window of the filter. The presence of a sample with which a bit has been associated is to be avoided within the convolution window. This sample would influence the processing of the associated bit by the polyphase filter because of its advance in comparison to the previous valid sample.

In the present embodiment, the convolution window comprises 8 bits.

We number the positions C of this window in a similar way to the memories of the shift register 4, i.e. from C-4 to C3, C0 being the current samples.

Figure 6:
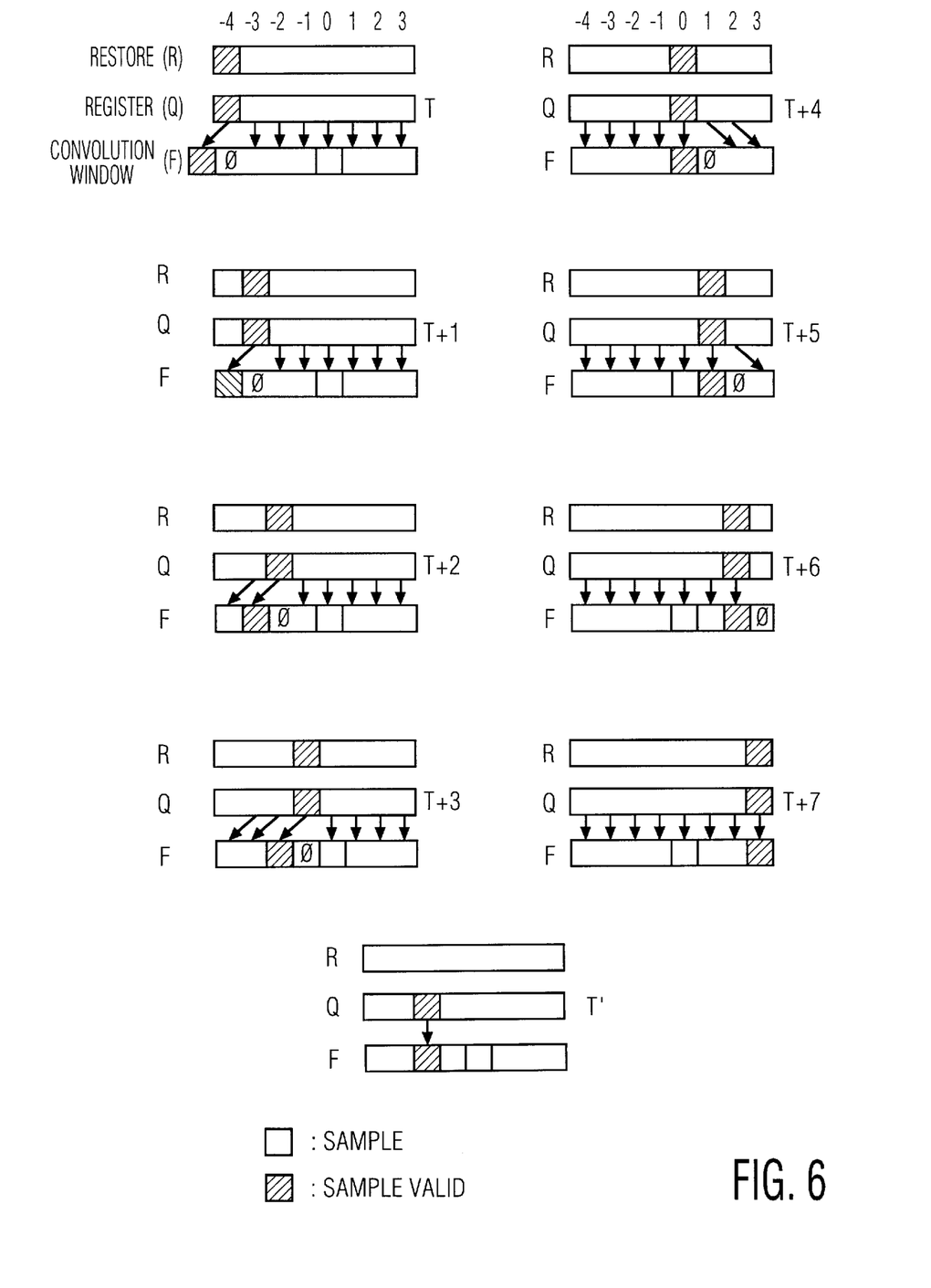
FIG. 6 is a diagram illustrating the convolution window when a single sample in phase rupture enters it.

FIG. 6 indicates the different cases that can arise when samples enter the convolution window.

The position of a sample in phase rupture Is indicated by the signal "Restore" or "R". The content of the shift register is indicated by the line "Q", whereas the content of the convolution window (at the output of the multiplexers) is designated by "F".

The eight diagrams associated with the time T+i show the effect on the content of the convolution window of the arrival in the shift register of a sample in phase rupture.

The processing carried out can be summarized as follows:
as long as no sample in phase rupture has entered the convolution window, the multiplexers are transparent: the contents of Qi and Fi are the same (diagram T of FIG. 6), when a sample in phase rupture is to the left of the current position (positions −4 to −1), it and its successors are shifted by one sample towards the left, a null sample being inserted at the position thus liberated in the convolution window. This offset is made by using the multiplexers 9a, 9b, 9c and/or 9d (diagrams T to T+3 of FIG. 6), when a sample is at the current position (position 0), or to the right of this position (1 to 3), then its predecessors are shifted by one sample towards the left, a null sample being inserted at the position thus liberated in the convolution window (diagrams T+4 to T+7).

The multiplexers are therefore controlled very simply by analyzing the "Restore" signal as described above.

As mentioned previously, the convolution window in the present case comprises 8 bits. It is obvious that other window sizes could be used.

The convolution window is used by a polyphase filter whose role is to build samples coded on eight bits for insertion into the digital video signal, using the samples coded on one bit of the convolution window.

The polyphase filter is a filter whose coefficients change from sample to sample. In the present case, 39 set of coefficients are necessary, given that a sample can have a phase error among 39 possible values (n*1.001 ns where n ranges from 0 to 38).

If we did not carry out the phase shifts, about four times more sets of coefficients would be necessary.

The sets of coefficients are stored in a ROM. This memory is addressed by the "Phase" signal generated by the sequencer. This signal indicates, for each current sample, the addresses of the coefficients corresponding to the phase error associated with this sample.

The sets of coefficients are in principle deduced from a curve having the shape of a pulse, such as that shown in FIG.

1. In effect, when a valid sample in the convolution window is a "1", this means that in the analog domain, the signal will include a pulse like that in FIG. 1.

It is obvious that, depending on the application, this shape of signal may be different.

The curve of FIG. 1, which is the curve corresponding to the Teletext specification, is designed taking into account certain transmission requirements. In the framework of the embodiment, the insertion of the Teletext information is carried out in the receiver. The transmission constraints are not therefore the same.

Figure 7:
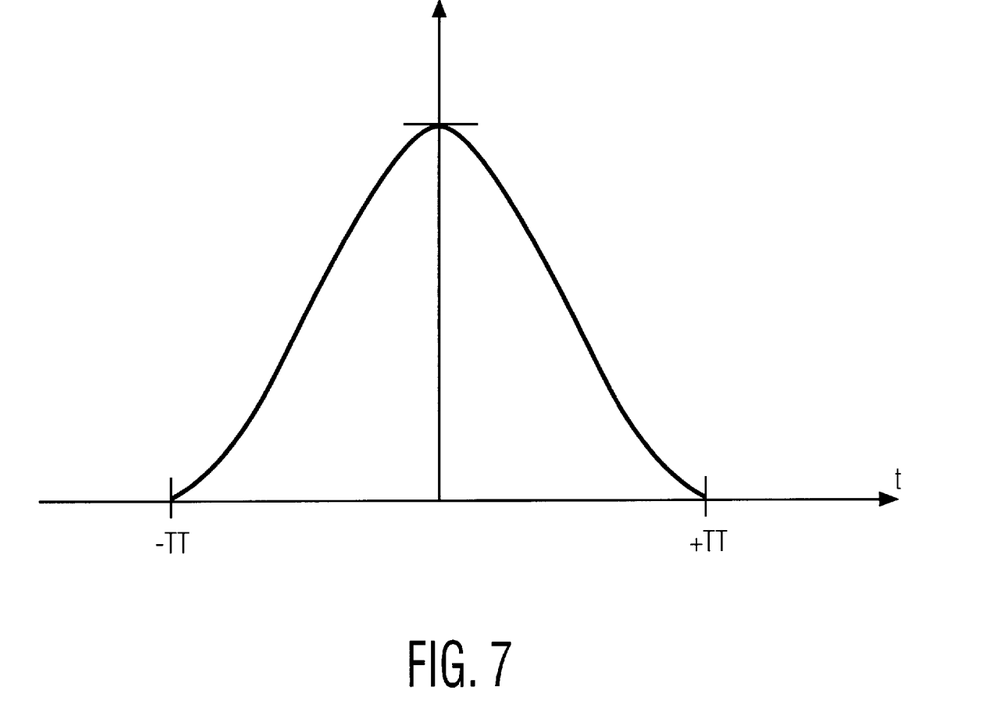
FIG. 7 shows a curve used to determine the sets of coefficients of the filter.

In the rest of this description, the determination of the coefficients will be based on the shape of the curve in FIG. 7, which shows a cosine period translated in the positive direction of the ordinates of a half-amplitude and whose maximum amplitude is positioned on this axis.

A set of coefficients is defined for a specific phase error, this error corresponding to a time in nanoseconds of $n*1.001$ ns, where n ranges from 0 to 38: for each set of coefficients, the curve will be translated from this value.

In the present embodiment, the coefficients are defined as follows:

$$C(p,x)=k*(0.5+0.5Cos\ (\pi(0.25X+Fp*P)))$$

where Fp=8.973 Mhz,

X ranges from −4 to 3,

P is equal to $n*1.001$ ns, n ranges from 0 to 38, k is a constant.

The coefficients thus calculated are used by the polyphase filter.

In the present embodiment, the polyphase filter includes a ROM (reference 11 of FIG. 5) containing coefficients and sums of coefficients.

Table 4 shows the organization of this ROM:

TABLE 4

| F-4 | F-3 | F-2 | F-1 | F0 | F1 | F2 | F3 | Coder output | DATA |
|---|---|---|---|---|---|---|---|---|---|
| 0 | 0 | 0 | 0 | 0 | 0 | 0 | 0 | 0 | 00 |
| 1 | 0 | 0 | 0 | 0 | 0 | 0 | 0 | 1 | C(p,−4) |
| 0 | 1 | 0 | 0 | 0 | 0 | 0 | 0 | 2 | C(p,−3) |
| 0 | 0 | 1 | 0 | 0 | 0 | 0 | 0 | 3 | C(p,−2) |
| 0 | 0 | 0 | 1 | 0 | 0 | 0 | 0 | 4 | C(p,−1) |
| 0 | 0 | 0 | 0 | 1 | 0 | 0 | 0 | 8 | C(p,0) |
| 1 | 0 | 0 | 0 | 1 | 0 | 0 | 0 | 9 | C(p,0)+C(p,−4) |
| 0 | 0 | 0 | 0 | 0 | 1 | 0 | 0 | A | C(p,1) |
| 0 | 1 | 0 | 0 | 0 | 1 | 0 | 0 | B | C(p,1)+C(p,−3) |
| 0 | 0 | 0 | 0 | 0 | 0 | 1 | 0 | C | C(p,2) |
| 0 | 0 | 1 | 0 | 0 | 0 | 1 | 0 | D | C(p,2)+C(p,−2) |
| 0 | 0 | 0 | 0 | 0 | 0 | 0 | 1 | E | C(p,3) |
| 0 | 0 | 0 | 1 | 0 | 0 | 0 | 1 | F | C(p,3)+C(p,−1) |

Table 4 shows the 13 possible states of the convolution window. Given that, in the framework of the present embodiment, the samples contained in this window are coded on a single bit, the polyphase filter will essentially have to carry out additions of coefficients. Also, given that the convolution window contains at most two samples having the value "1", one addition at most will have to be carried out for a given current sample. The storage of the results of the additions directly in the ROM economizes an adder.

The 13 states of the convolution window are coded by a 4-bit coder (see FIG. 5). The 39 possible phases are coded using 6 bits by the sequencer. The 10 resulting bits are then used to address the ROM, whose size is 39×13 words of 8 bits.

It is obvious that the invention is not limited to the case where the data from the first source at bit rate Fp are coded using a single bit.

Secondly, in the present example, the ratio Fp/Fb is close to 4. For this reason, most of the data from the binary source are associated with 4 samples. Some are associated with only three samples, which enables phase errors introduced by advancing a data by one sample to be recovered by a relatively large phase shift. It is obvious that when the ratio Fp/Fb is such that its decimal part is less than 0.5, the correction will be carried out by delaying a data by one sample.

What is claimed is:

1. Method for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the samples being presented to a polyphase filter for which a set of coefficients is associated with a specific phase error previously introduced by said associations, the filtered samples being included in the digitized signal.

2. Method according to claim 1, wherein said sets of coefficients of said polyphase filter are deduced from the required wave-form of the data from the first source in the digitized signal.

3. Method according to claim 2, wherein said polyphase filter includes memory in which are stored the possible results of a filtering, said memory being addressed, for each current sample of the convolution window of the filter, first by data representing the phase error associated with this filter and secondly by data representing the content of the convolution window.

4. Method for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the sample being presented to a polyphase filter for which a set of coefficients is associated with a specific phase error previously introduced by said associations, the filtered samples being included in the digitized signal, wherein the association of the data of the first source with samples whose bit rate is that of the second source is carried out such that, on average, a data from the first source is associated substantially with Q samples, where:

$$Q=Fp/Fb$$

Fb and Fp being respectively the bit rates of the first and second sources.

5. Method for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the sample being presented to a polyphase filter for which a set of coefficients is associated with a specific phase error previously introduced by said associations, the filtered samples being included in the digitized signal, wherein the association of the data of the first source with samples whose bit rate is that of the second source is carried out such that this M data from the first source are associated with N samples, where M and N are the smallest integer values for which:

Fp/Fb=N/M

Fb and Fp being respectively the bit rates of the first and second sources.

6. Method according to claim 4, wherein a data from the first source is repeated as long as a theoretical repetition rate is less than a current repetition rate, the theoretical repetition rate being the ratio Fp/Fb, the current repetition rate being the ratio of the number of samples emitted to the number of different data emitted by the first source.

7. Method according to claim 6, wherein among the samples carrying a same given data from the first source, all except one are forced to the null value.

8. Method according to claim 7, wherein the sample retained at its initial value is the first of the samples sample carrying said same given data from the first source.

9. Method for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the sample being presented to a polyphase filter for which a set of coefficients is associated with a specific phase error previously introduced by said associations, the filtered samples being included in the digitized signal, wherein said samples emitted at a bit rate Fp from the second source carry a data from the first source when theoretical repetition rate becomes greater than a current repetition rate, the theoretical repetition rate being a ratio Fp/Fb, the current repetition rate being the ratio between the number of samples emitted and the number of different data emitted by the first source, and wherein all other samples carry a null value.

10. Method according to claim 9, wherein, certain samples being repeated X times, where X is a theoretical repetition rate rounded to a nearest integer.

11. Method according to claim 10, wherein the samples presented to said polyphase filter are offset.

12. Method according to claim 10, wherein the series of samples crosses the convolution window of the polyphase filter.

13. Method for insertion of samples representing digital data from a first source having a first bit rate in a digitized signal from a second source having a second bit rate, wherein the second bit rate is greater than the first bit rate, and each data of the first source is associated with at least one sample of a series of samples at the second bit rate, the sample being presented to a polyphase filter for which a set of coefficients is associated with a specific phase error previously introduced by said associations, the filtered samples being included in the digitized signal, wherein said sets of coefficients are defined by:

$$C(P,X)=k*(0.5+0.5Cos\ (\pi(m*X+Fp*P))$$

where X is a coefficient within the set,

P is the phase error associated with the set, k is a constant, m is a constant that is a function of the number of coefficient per set.

14. Device for insertion of samples representing digital data from a first source having a first bit rate in a digitized signal from a second source having a second bit rate, wherein the second bit rate is greater than the first bit rate, said device including means of association of the data from the first source with one or more samples at the bit rate of the second source, means of polyphase filtering said samples whose sets of coefficients depend on phase errors previously introduced, and means of inclusion of the filtered samples in the digitized signal.

15. Device according to claim 14, wherein said means of association include means of memorization of the number of samples to be associated with each data from the first source.

16. Device according to claim 14, wherein the device also includes means of decimation of the sequence of samples carrying the data from the first source, said means of decimation forcing all the samples carrying the same data to zero, except for one of these samples.

17. Device according to claim 14, wherein the device also includes a shift register and means of multiplexing controlled in such a way that the samples presented to the filter are not in phase rupture.

18. Device according to claim 14, wherein the means of polyphase filtering include means of memorization of the possible results of a filtering, said means of memorization being addressed by making use of the content of the convolution window of the filter and phase errors associated with each sample.

19. Device for insertion of samples representing digital data from a first source having a first bit rate in a digitized signal from a second source having a second bit rate, wherein the second bit rate is greater than the first bit rate, said device including means of association of the data from the first source with one or more samples at the bit rate of the second source, means of polyphase filtering said samples whose sets of coefficients depend on a phase errors previously introduced, and means of inclusion of the filtered samples in the digitized signal, wherein the sets of coefficients are defined by:

$$C(P,X)=k*(0.5+0.5Cos\ (\pi(0.25X+Fp*P))$$

where X is a coefficient within the set,

P is the phase error associated with the set, k is a constant.

* * * * *